(12) United States Patent
Sakata et al.

(10) Patent No.: US 9,076,644 B2
(45) Date of Patent: Jul. 7, 2015

(54) SUBSTRATE PROCESSING APPARATUS, SUBSTRATE SUPPORTER AND METHOD OF MANUFACTURING SEMICONDUCTOR DEVICE

(75) Inventors: Masakazu Sakata, Toyama (JP); Hidehiro Yanai, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 67 days.

(21) Appl. No.: 13/980,144

(22) PCT Filed: Jan. 16, 2012

(86) PCT No.: PCT/JP2012/050729
§ 371 (c)(1),
(2), (4) Date: Aug. 30, 2013

(87) PCT Pub. No.: WO2012/099064
PCT Pub. Date: Jul. 26, 2012

(65) Prior Publication Data
US 2014/0004710 A1    Jan. 2, 2014

(30) Foreign Application Priority Data
Jan. 18, 2011 (JP) .................. 2011-007884

(51) Int. Cl.
*C23C 16/00* (2006.01)
*H01L 21/02* (2006.01)
*H01L 21/67* (2006.01)
(Continued)

(52) U.S. Cl.
CPC ...... *H01L 21/02104* (2013.01); *H01L 21/6719* (2013.01); *H01L 21/67781* (2013.01); *H01L 21/68742* (2013.01); *H01L 21/6875* (2013.01)

(58) Field of Classification Search
CPC ............ H01L 21/6831; H01L 21/68785; H01L 21/6719; H01L 21/68742; H01L 21/6875
See application file for complete search history.

(56) References Cited

U.S. PATENT DOCUMENTS 6,120,608 A * 9/2000 Shendon et al. ............... 118/728
2001/0025691 A1* 10/2001 Kanno et al. .................. 156/345
(Continued)

FOREIGN PATENT DOCUMENTS

| JP | A-07-022500 | 1/1995 |
| JP | A-2001-291669 | 10/2001 |

(Continued)

OTHER PUBLICATIONS

International Preliminary Report on Patentability issued in International Patent Application No. PCT/JP2012/050729 dated Jul. 23, 2013.
(Continued)

*Primary Examiner* — Bac Au
(74) *Attorney, Agent, or Firm* — Oliff PLC

(57) ABSTRACT

A substrate processing apparatus of the present invention includes a substrate placement stage installed in the process chamber, and configured to place the substrate on a substrate placement surface, with a flange provided on its side face; a heating element arranged in the substrate placement stage and configured to heat the substrate; a plurality of struts configured to support the flange from below, and an exhaust unit configured to exhaust an atmosphere in the process chamber, wherein the supporting member is provided between the substrate placement stage and the plurality of struts.

13 Claims, 11 Drawing Sheets

(51) Int. Cl.
*H01L 21/677* (2006.01)
*H01L 21/687* (2006.01)

(56) References Cited

U.S. PATENT DOCUMENTS

| | | | |
|---|---|---|---|
| 2001/0027970 A1 | 10/2001 | Li et al. | |
| 2003/0164226 A1* | 9/2003 | Kanno et al. | 156/345.51 |
| 2005/0045618 A1 | 3/2005 | Ito | |
| 2007/0095289 A1 | 5/2007 | Arami | |
| 2009/0059461 A1 | 3/2009 | Yonekura et al. | |
| 2009/0258148 A1* | 10/2009 | Moriya et al. | 427/343 |
| 2010/0050943 A1 | 3/2010 | Kato et al. | |
| 2010/0068895 A1 | 3/2010 | Yanai et al. | |
| 2010/0163403 A1* | 7/2010 | Kitada et al. | 204/164 |
| 2012/0329290 A1* | 12/2012 | Shimada et al. | 438/795 |

FOREIGN PATENT DOCUMENTS

| | | |
|---|---|---|
| JP | A-2005-019479 | 1/2005 |
| JP | A-2005-207140 | 8/2005 |
| JP | A-2009-88347 | 4/2009 |
| JP | A-2010-048924 | 3/2010 |
| JP | A-2010-098296 | 4/2010 |
| JP | A-2010-199382 | 9/2010 |
| KR | 2009-0023061 A | 3/2009 |
| TW | 569643 | 1/2004 |
| TW | 201017805 | 5/2010 |
| TW | 201027655 | 7/2010 |

OTHER PUBLICATIONS

Apr. 23, 2014 Taiwanese Office Action issued in Taiwanese Application No. 101101899 (with translation).

Nov. 19, 2013 Japanese Office Action issued in Japanese Application No. 2012-553708 (with translation).

May 15, 2014 Japanese Office Action issued in Japanese Application No. 2012-553708 (with translation).

Nov. 13, 2014 Office Action issued in Korean Patent Application No. 10-2013-7016087.

\* cited by examiner

FIG. 7
(a)
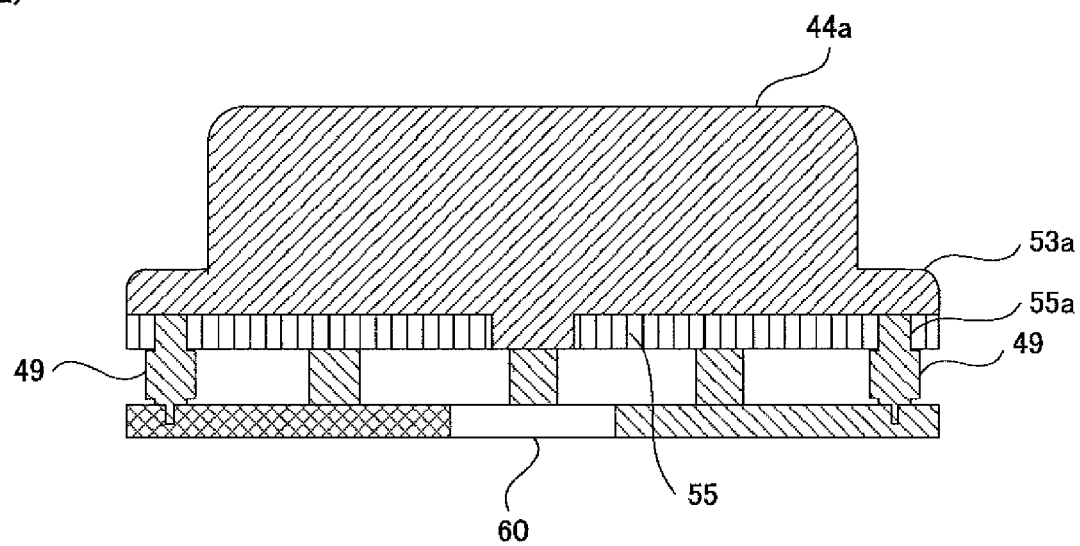
(b)
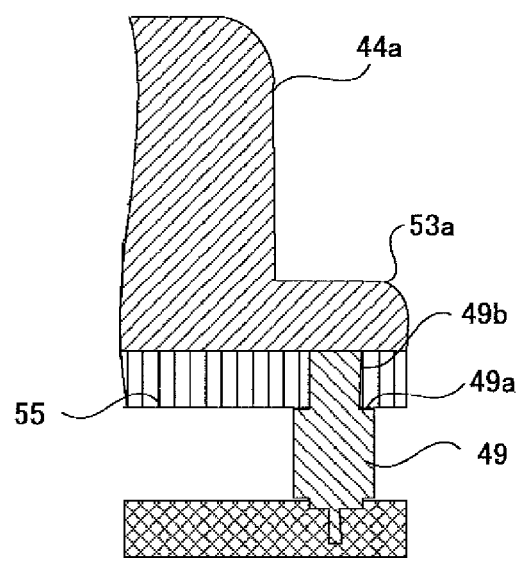

FIG.13
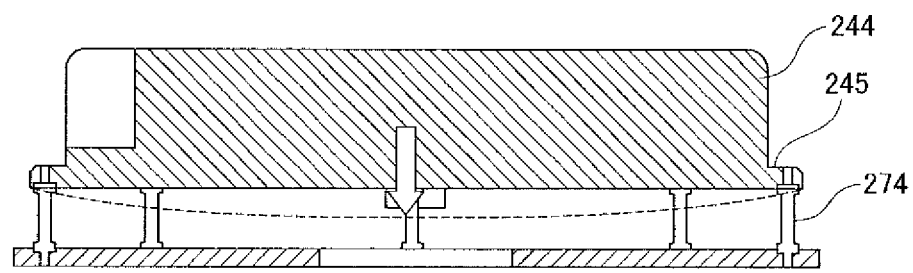
(a)
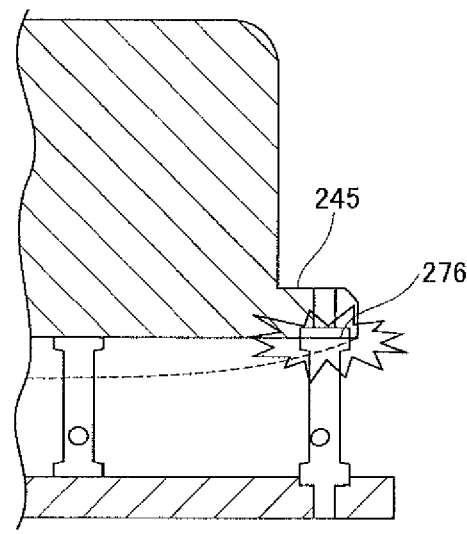
(b)

SUBSTRATE PROCESSING APPARATUS, SUBSTRATE SUPPORTER AND METHOD OF MANUFACTURING SEMICONDUCTOR DEVICE

TECHNICAL FIELD

The present invention relates to a substrate processing apparatus for heating and processing a substrate, a substrate supporter and a method of manufacturing a semiconductor device.

DESCRIPTION OF RELATED ART

Conventionally, for example as a step of a method of manufacturing a semiconductor device such as DRAM, etc., for example, a substrate processing step has been executed, which is the step of performing various processing such as formation of a thin film on a substrate and ashing, etc., by supplying a gas onto a substrate heated to a desired temperature. Further, the substrate processing step such as annealing, etc., for heating the substrate, is also executed. Such a substrate processing step is executed by a single wafer type substrate processing apparatus for processing the substrate one by one for example. Such a substrate processing apparatus includes a substrate processing chamber for processing a substrate; a gas supply unit configured to supply a processing gas into a process chamber; a substrate placement stage installed in the process chamber and configured to place the substrate on a substrate placement surface; a heating element arranged in the substrate placement stage and configured to heat the substrate; and an exhaust unit configured to exhaust an atmosphere in the process chamber. A substrate processing apparatus for heating and processing substrates is disclosed in patent document 1 for example.

PRIOR ART DOCUMENT

Patent Document

Patent document 1:
Japanese Patent Laid Open Publication No. 2009-88347

SUMMARY OF THE INVENTION

Problem to be Solved by the Invention

In the manufacturing step of a semiconductor device in recent years, a high-speed substrate processing is requested, to improve a production efficiency of the semiconductor device. As one of the means for improving the production efficiency, for example, a high temperature is required for substrate processing. Further, in order to improve the production efficiency, uniformity in a plane of a substrate during substrate processing is requested, and uniform heating in the plane of the substrate is requested. Further, for example, when the substrate processing of forming a thin film on the substrate is performed, there is no difference in quality (thickness, etc.) of the thin film between a substrate processed first and a substrate processed last in one batch. Namely, higher reproducibility of the substrate processing is requested.

However, in a conventional substrate processing apparatus, struts for supporting the substrate placement stage from below, are provided under the substrate placement surface in some cases. Namely, the struts are provided under a heating element arranged in the substrate placement stage in some cases. When the substrate is processed using such a substrate processing apparatus, the substrate cannot be heated at a uniform temperature in the plane, because the struts are positioned under the heating element, thus sometimes reducing the uniformity in the plane of the substrate during substrate processing. Namely, heat from the heating element is absorbed by the struts positioned under the heating element, thereby generating a local escape of heat, and therefore in some cases, the plane of the substrate which is placed in the upper part of the heating element cannot be heated uniformly.

An object of the present invention is to provide the substrate processing apparatus, the substrate supporter and the method of manufacturing a semiconductor device capable of improving uniformity in the plane of the substrate during substrate processing, and capable of performing the substrate processing with high reproducibility.

Solution to Problem

According to an aspect of the present invention, there is provided a substrate processing apparatus, including:
a process chamber configured to process a substrate:
a gas supply unit configured to supply a processing gas into the process chamber;
a substrate placement stage installed in the process chamber, and configured to place the substrate on a substrate placement surface, with a flange provided on its side face;
a heating element arranged in the substrate placement stage and configured to heat the substrate;
a plurality of struts configured to support the flange from below, and
an exhaust unit configured to exhaust an atmosphere in the process chamber,
wherein the supporting member is provided between the substrate placement stage and the plurality of struts.

According to other aspect of the present invention, there is provided a substrate holder, including:
a substrate placement stage configured to place a substrate on a substrate placement surface, with a flange provided on its side face;
a heating element arranged in the substrate placement stage, and configured to heat the substrate; and
a plurality of struts configured to support the flange from below,
wherein a supporting member is provided between the substrate placement stage and the plurality of struts.

According to further other aspect of the present invention, there is provided a method of manufacturing a semiconductor device, including:
loading a substrate into a process chamber;
placing the substrate on a substrate placement surface of a substrate holder including a substrate placement stage installed in the process chamber, with a flange provided on its side face and configured to place the substrate on the substrate placement surface, and a plurality of struts for supporting the flange from below, and a supporting member for supporting at least the flange between the substrate placement stage and the plurality of struts;
processing the substrate by heating the substrate by the heating element while exhausting an inside of the process chamber by an exhaust unit, with the substrate placed on the substrate placement surface, and supplying a processing gas into the process chamber by a gas supply unit; and
unloading the substrate after processing, from the process chamber.

Advantage of the Invention

According to a substrate processing apparatus, a substrate supporter and a method of manufacturing a semiconductor device of the present invention, uniformity in a plane of a substrate during substrate processing can be improved, and the substrate processing with high reproducibility can be performed.

BRIEF DESCRIPTION OF THE DRAWINGS

FIG. 7 is a schematic view of a substrate placement stage according to an embodiment of the present invention, wherein (a) is a vertical sectional view of the substrate placement stage, and (b) is a partial expanded view of (a).

FIG. 13 is a schematic view of the substrate placement stage housed in the conventional substrate processing apparatus, wherein (a) is a vertical sectional view of the substrate placement stage, and (b) is a partial expanded view of (a).

MODES FOR CARRYING OUT THE INVENTION

An Embodiment of the Present Invention

An embodiment of the present invention will be described hereafter, with reference to the drawings.

(1) Structure of a Substrate Processing Apparatus

Figure 1:
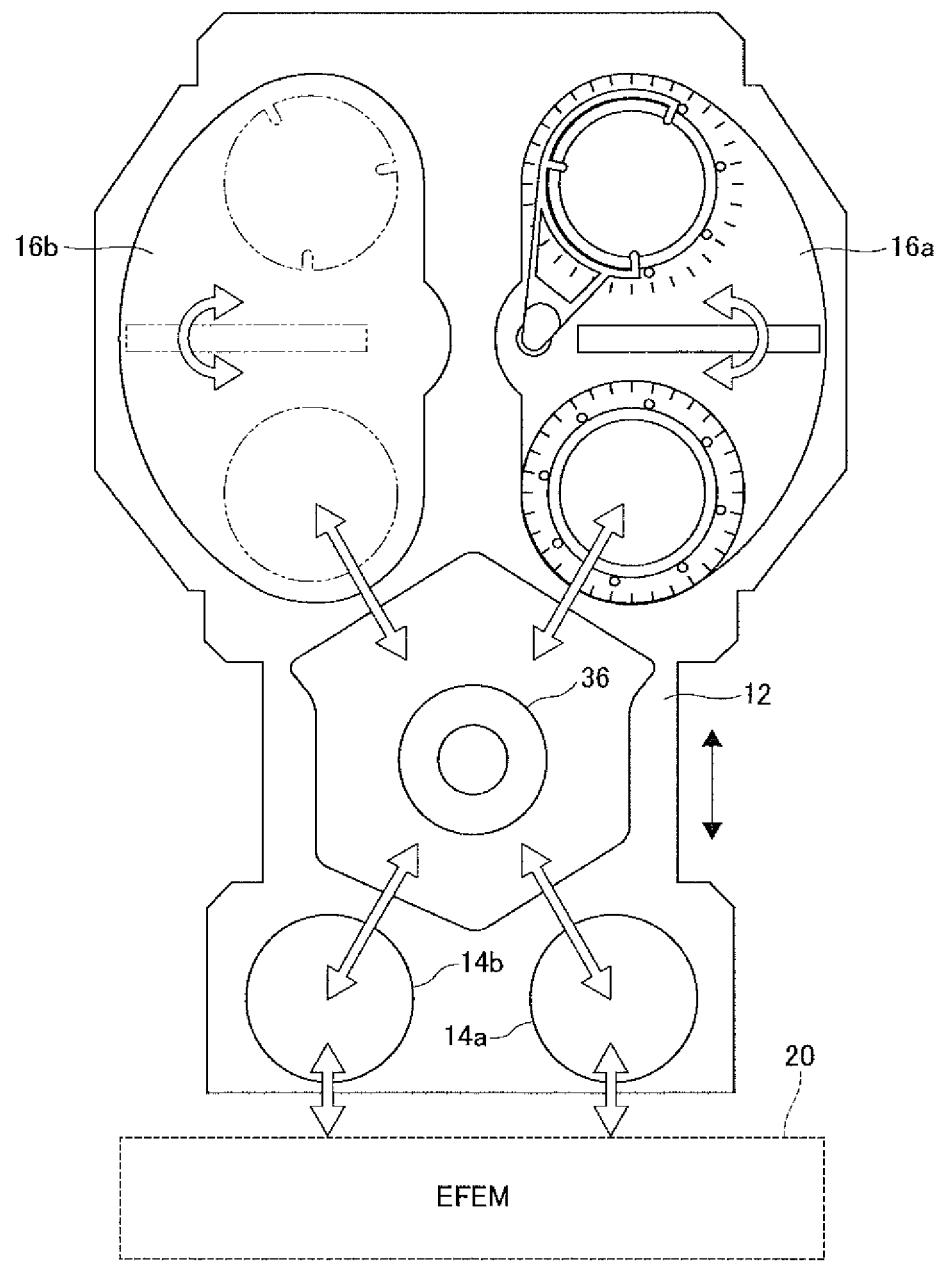
FIG. 1 is a lateral sectional schematic view of a substrate processing apparatus according to an embodiment of the present invention.
Figure 2:
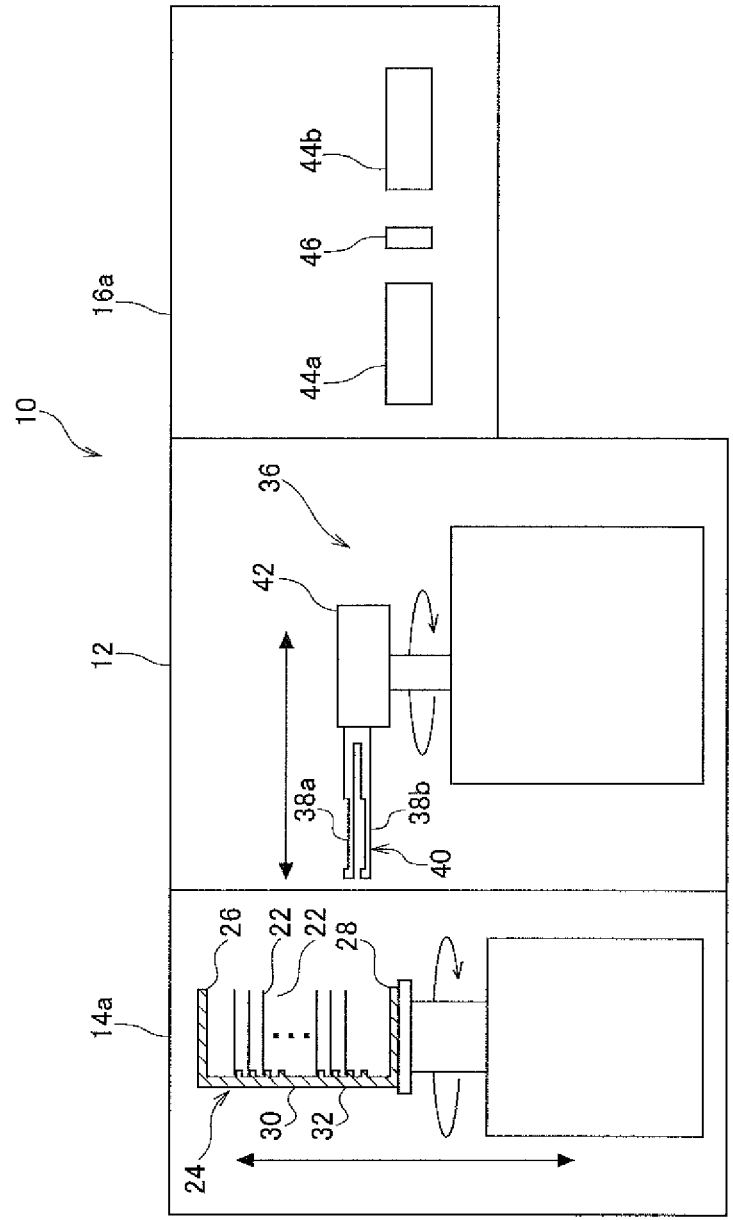
FIG. 2 is a vertical sectional view of the substrate processing apparatus according to an embodiment of the present invention.

FIG. 1 is a lateral sectional view of a substrate processing apparatus according to this embodiment. FIG. 2 is a vertical sectional view of the substrate processing apparatus according to this embodiment. FIG. 1 and FIG. 2 show an outline of a substrate processing apparatus 10 such as a semiconductor manufacturing apparatus according to an embodiment of the present invention.

As shown in FIG. 1, in the substrate processing apparatus 10, two load lock chambers 14a, 14b and two process chambers 16a, 16b are disposed, with a transfer chamber 12 as a center for example, and an atmospheric transfer chamber (EFEM: Equipment Front End Module) 20 for transferring substrates between the load lock chambers 14a, 14b and a carrier such as a cassette, is disposed on an upstream side of the load lock chambers 14a, 14b. Three hoops (not shown) are disposed in the atmospheric transfer chamber 20, so as to be capable of accommodating twenty-five substrates for example at a specific interval in a vertical direction. Further, an atmospheric robot (not shown) for transferring five substrates for example, between the atmospheric transfer chamber 20 and the load lock chambers 14a, 14b, is disposed in the atmospheric transfer chamber 20. For example, the transfer chamber 12, the load lock chambers 14a, 14b and the process chambers 16a, 16b are formed by one component made of aluminum (A5052).

First, structures of the load lock chambers 14a, 14b will be described. Explanation for the load lock chamber 14b is omitted, because the structure is the same between the load lock chamber 14b and the load lock chamber 14a, although they are disposed at symmetrical positions with respect to each other.

As shown in FIG. 2, a substrate support body (boat) 24 for accommodating twenty-five substrates 22 such as wafers vertically at a specific interval, is provided in the load lock chamber 14a. The substrate support body is made of silicon carbide, etc., including three struts 30 for example, for connecting an upper plate 26 and a lower plate 28. Placement sections 32 for placing the twenty-five substrates 22 for example, are formed in parallel at an inside in a longitudinal direction of each struts 30. Further, the substrate support body 24 is configured to move in a vertical direction (move in upper and lower directions) in the load lock chamber 14a, and is configured to be rotated with a vertically extending rotary shaft as an axis. By a movement of the substrate support body 24 in the vertical direction, every two substrates 22 are simultaneously transferred from a pair of fingers 40, onto an upper surface of the placement sections 32 provided to each of the three struts 30 of the substrate support body 24. Further, by the movement of the substrate support body 24 in the vertical direction, every two substrates 22 are simultaneously transferred onto the pair of fingers 40 from the substrate support body 24.

A vacuum robot 36 for transferring the substrates 22 between the load lock chamber 14a and the process chamber 16a, is provided in the transfer chamber 12. The vacuum robot 36 includes an arm 42 having a pair of fingers 40 composed of an upper finger 38a and a lower finger 38b. The upper finger 38a and the lower finger 38b have the same shape for example, and are separated from each other vertically with a specific interval between them, and are provided extending horizontally in the same direction respectively, and capable of simultaneously supporting the substrates 22 respectively. The arm 42 is configured to rotate with a vertically extending rotation shaft as an axis, and is configured to move horizontally, and is configured to simultaneously transfer two substrates 22.

(2) Structure of the Process Chamber

Next, structures of the process chambers 16a, 16b are described mainly based on FIG. 3 to FIG. 7. Explanation for the process chamber 16b is omitted, because the structure is the same between the process chamber 16b and the process chamber 16a, although they are disposed at symmetrical positions with respect to each other.

Figure 3:
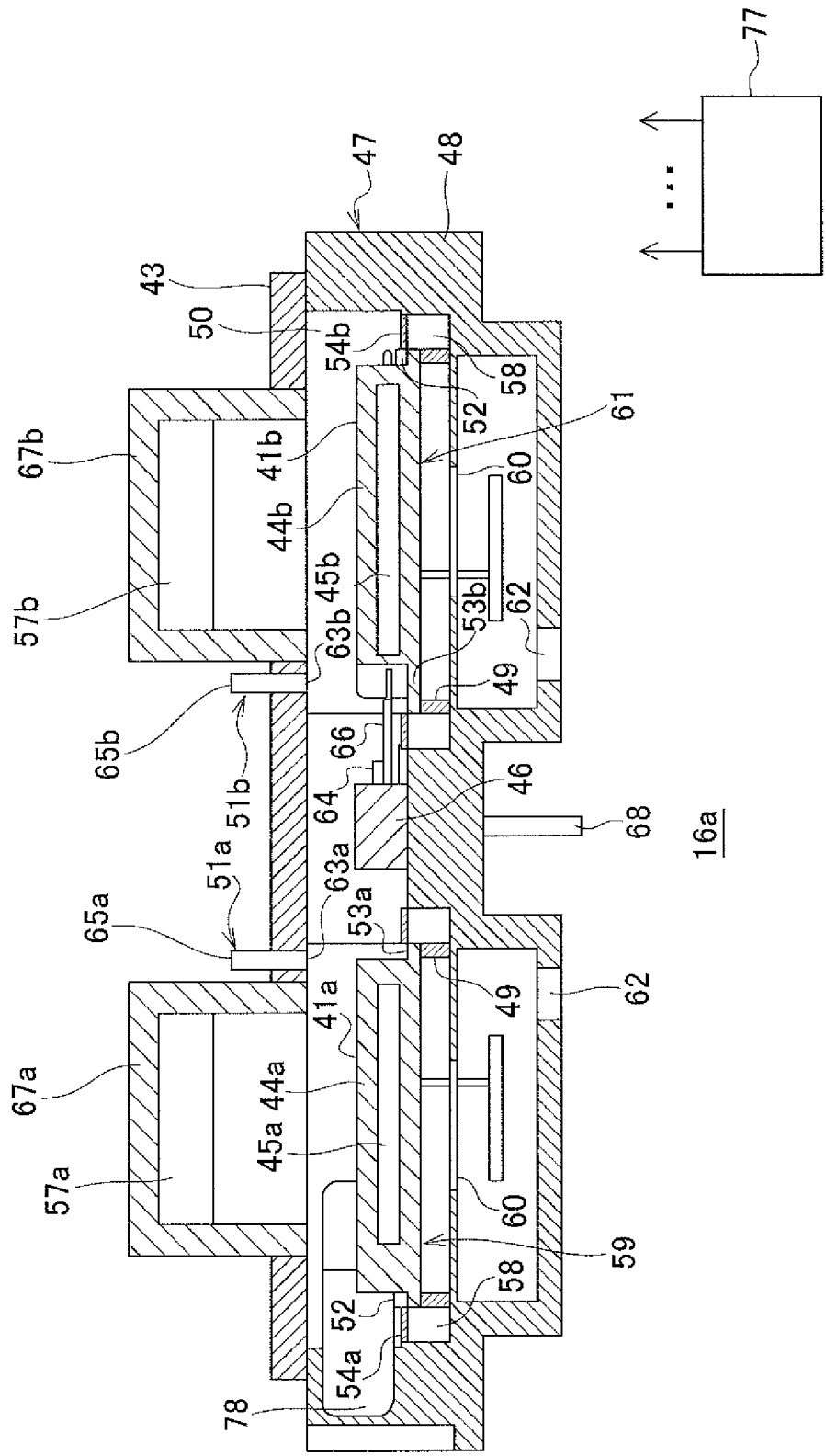
FIG. 3 is a vertical sectional schematic view of a process chamber according to an embodiment of the present invention.
Figure 4:
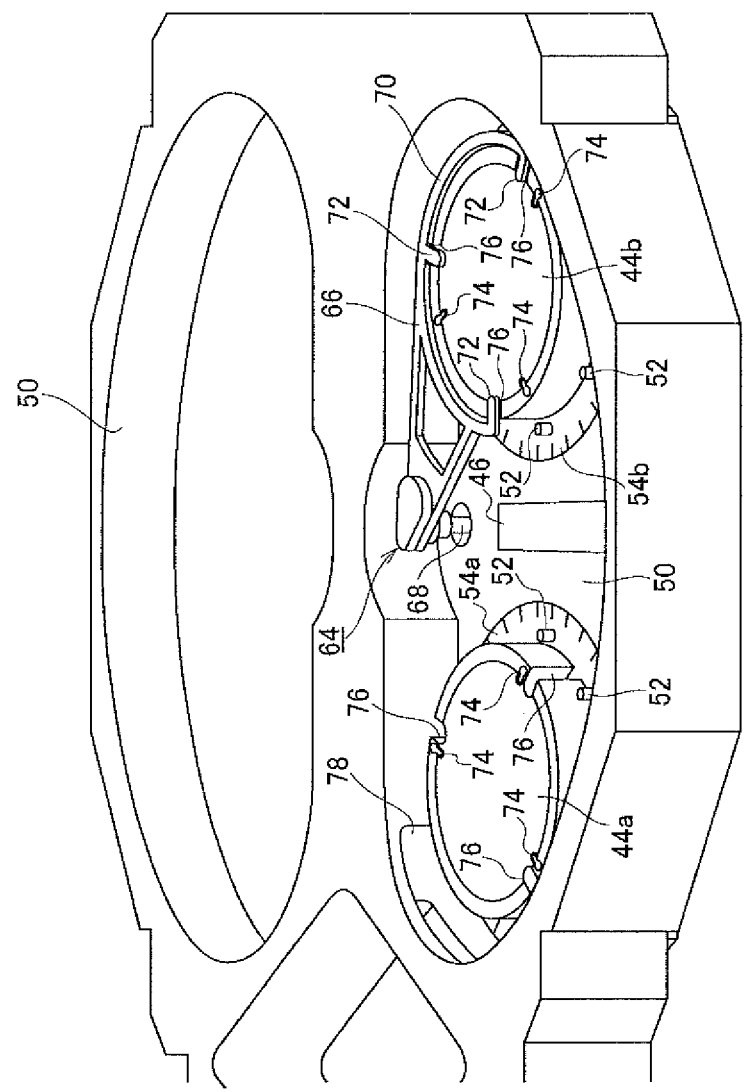
FIG. 4 is a perspective view showing the process chamber according to an embodiment of the present invention.
Figure 5:
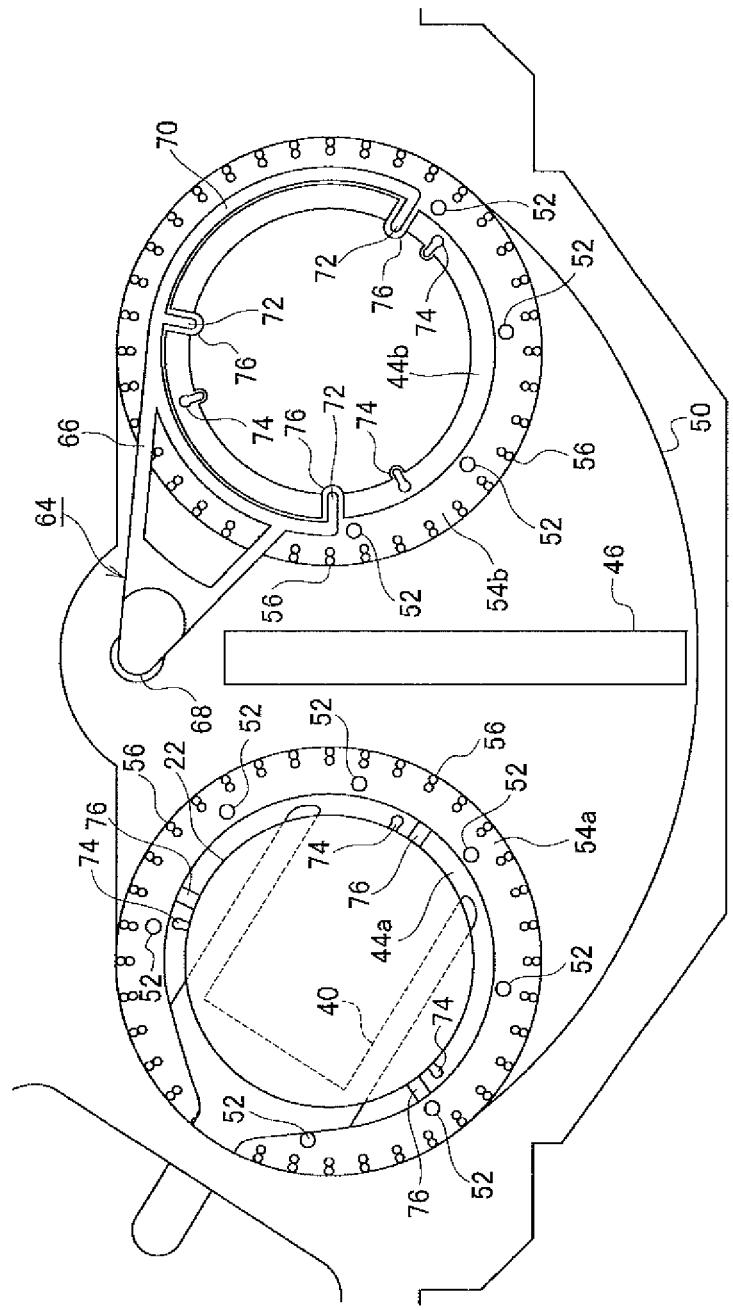
FIG. 5 is a lateral sectional view of the process chamber according to an embodiment of the present invention.
Figure 6:
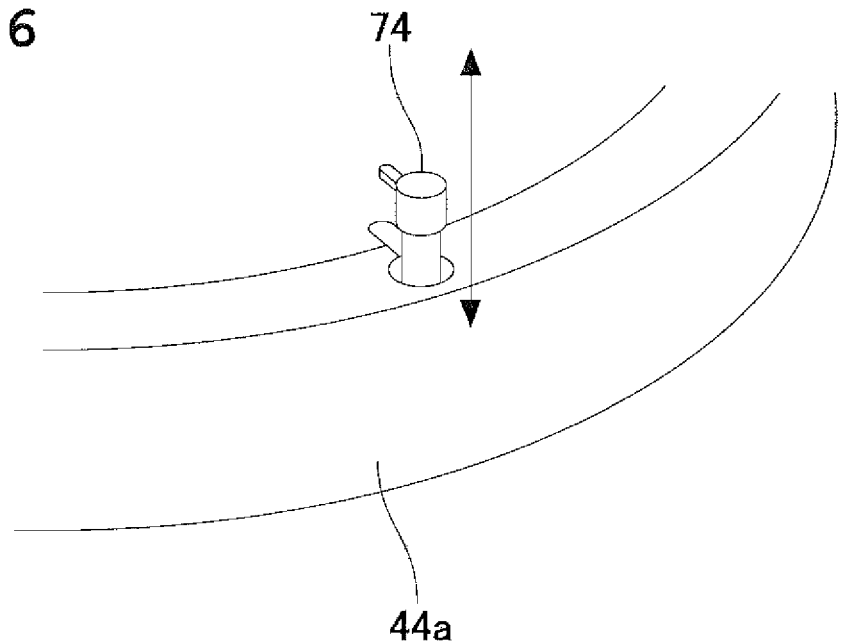
FIG. 6 is a schematic view showing an operation of a substrate holding pin according to an embodiment of the present invention.

FIG. 3 is a vertical sectional schematic view of the process chamber 16a housed in the substrate processing apparatus 10 according to this embodiment. FIG. 4 is a perspective view of the process chamber 16a housed in the substrate processing apparatus 10 according to this embodiment. FIG. 5 is a lateral sectional schematic view of the process chamber 16a housed in the substrate processing apparatus according to this embodiment. FIG. 6 is a schematic view showing an operation of a substrate holding pin according to this embodiment. FIG. 7 is a schematic view of a substrate placement stage according to this embodiment, wherein (a) is a vertical sectional view of the substrate placement stage, and (b) is a partial expanded view of (a).

As shown in FIG. 3 to FIG. 5, the transfer chamber 12 and the process chamber 16a are communicated with each other through a gate valve 78. The process chamber 16a includes a processing vessel 47. The processing vessel 47 includes a cap-like lid member 43 and a lower side vessel 48. The processing vessel 47 is formed so that the lid member 43 is air-tightly provided on the lower side vessel 48. The lid member 43 is made of aluminum oxide or a non-metal material such as quartz, etc., for example, and the lower side vessel 48 is made of aluminum, etc., for example. In the processing vessel 47, a reaction chamber 50 for housing the substrates 22 is formed.

Two substrate placement stages 44a, 44b are disposed in the reaction chamber 50 as substrate supporters. Namely, substrate placement stages 44a, 44b are respectively provided in the same space of the reaction chamber 50. Substrate placement surfaces 41a, 41b for placing the substrates 22 thereon, are provided on the upper surfaces of the substrate placement stages 44a, 44b, namely on the surfaces facing the lid member of the substrate placement stages 44a, 44b. The substrate placement stage 44b is disposed in a far distance, viewed from the transfer chamber 12 with the substrate placement stage 44a interposed between them. The reaction chamber 50 includes a first processing member 59 having a first substrate placement stage 44a, and a second processing member 61 having a second substrate placement stage 44b. A partition member 46 partitioning the first processing member 59 and the second processing member 61 partially in the horizontal direction, is provided in the space between the first processing member 59 and the second processing member 61. The first processing member 59 and the second processing member 61 have independent structures respectively. The first processing member 59 and the second processing member 61 are disposed in one row in the same direction as a flowing direction of the substrate processing, viewed from the whole body of the substrate processing apparatus 10. Namely, the second processing member 61 is disposed far from the transfer chamber 12, with the first processing member 59 interposed between them. The first processing member 59 and the second processing member 61 are communicated with each other. The temperature in the process chamber 16a can be raised up to 300° C. for example.

Then, the process chamber 16a is formed so that heat treatment can be simultaneously applied to two substrates 22 in the same space of the reaction chamber 50, by placing the substrates 22 on the substrate placement stages 44a, 44b using the vacuum robot 36.

Here, the partition member 46 is a prismatic member provided attachably and detachably to/from the processing vessel 47 for example. The partition member 46 is made of aluminum (A5052 or A5056, etc.), quartz or alumina, etc., for example. Also, the partition member 46 is disposed in the reaction chamber 50 so that the space in the reaction chamber 50 is not completely separated.

(Substrate Supporter)

As described above, two substrate placement stages 44a, 44b for placing the substrates 22 on the substrate placement surfaces 41a, 41b as substrate supporters respectively, are disposed on a bottom side in the reaction chamber 50. The first substrate placement stage 44a and the second substrate placement stage 44b are fixed to the processing vessel 47 by a fixing member 52 in the process chamber 16a. Note that the substrate placement stages 44a, 44b are electrically insulated from the processing vessel 47.

Flanges 53a, 53b are provided around the substrate placement stages 44a, 44b, along the side faces of the substrate placement stages 44a, 44b. Namely, the flanges 53a, 53b are provided so that the surfaces of the flanges 53a, 53b are different surfaces from the substrate placement surfaces 41a, 41b, and the surfaces of the flanges 53a, 53b are lower than a height position of the substrate placement surfaces 41a, 41b. Thus, as described later, a storage space for storing a robot arm as a substrate carrier, can be formed during processing of the substrate 22. Then, the substrate placement stages 44a, 44b are respectively supported by a plurality of struts 49 from below via the flanges 53a, 53b. Such a supporting structure will be described later.

Heights of the substrate placement stages 44a, 44b are formed so as to be lower than the height of the inside of the reaction chamber 50. The substrate placement stages 44a, 44b are fixed to the processing vessel 47 respectively by using the fixing member 52 such as fixing pins, etc.

The substrate placement stages 44a, 44b are made of a material having a high thermal conductivity such as aluminum (for example A5052 and A5056, etc.). Thus, by forming the substrate placement stages 44a, 44b using a material with high thermal conductivity such as aluminum for example, heat from heaters 45a, 45b as heating elements described later, can be efficiently and uniformly transmitted to each substrate 22. Accordingly, the substrate 22 can be heated so that the temperature is uniform in the plane, and the uniformity in the plane of the substrate during substrate processing can be improved.

As described above, the substrate placement stages 44a, 44b are preferably made of aluminum. However, the substrate placement stages 44a, 44b may also be made of stainless (SUS) or aluminumnitride (AlN), etc. When the substrate placement stages 44a, 44b are made of SUS, heat-resisting property can be improved although the thermal conductivity is low, compared with a case that they are made of aluminum. Further, when the substrate placement stages 44a, 44b are made of AlN, the thermal conductivity is high although the heat-resisting property is low, compared with a case that they are made of aluminum. Therefore, heat can be more efficiently and uniformly transmitted to the substrates 22. Also, for example, the surfaces of the substrate placement stages 44a, 44b made of SUS can be covered with aluminum. Thus, the heat-resisting property of the substrate placement stages 44a, 44b can be improved, although cracks are sometimes generated on the substrate placement stages 44a, 44b, due to a difference in thermal expansion coefficient between SUS and aluminum.

The heaters 45a, 45b as the heating elements are respectively arranged in the substrate placement stages 44a, 44b, under the substrate placement surfaces 41a, 41b, so that the substrates 22 can be heated. When power is supplied to the heaters 45a, 45b, the surface of each substrate 22 is heated to a specific temperature (for example, about 300° C.). Note that temperature sensors (not shown) are provided on the substrate placement stages 44a, 44b. A controller 77 described later, is electrically connected to the heaters 45a, 45b and the temperature sensors. The controller 77 is configured to control the power supplied to the heaters 45a, 45b, based on temperature information detected by the temperature sensors.

As shown in FIG. 6, for example three substrate holding pins 74 are provided on outer periphery of the substrate placement surface 41a of the substrate placement stage 44a and the substrate placement surface 41b of the substrate placement stage 44b respectively, so as to vertically penetrate the surfaces. As shown in FIG. 6 by arrow, the substrate holding pins 74 are configured to be vertically elevated in a non-contact state with the substrate placement stages 44a, 44b. Thus, the substrates 22 transferred into the process chamber 16a through the vacuum robot 36, etc., from the transfer chamber 12, are respectively placed on the substrate holding pins 74, and thereafter are placed on the first substrate placement stage 44a (namely the first substrate placement surface 41a) and the second substrate placement stage 44b (namely the second substrate placement surface 41b) by vertically elevating/descending the substrate holding pins 74.

Further, groove portions 76 are provided vertically (in upper and lower directions) on the substrate placement stages 44a, 44b respectively, so that protruding portions 72 provided on the robot arm 64 described later, can move from an upper part to a lower part over the substrate placement surfaces 41a, 41b. The groove portions 76 of the same numbers as the numbers of the protruding portions 72 (three in this embodiment) are provided at positions corresponding to the protruding portions 72 provided on the robot arm 64.

(Supporting Member)

As shown in FIG. 7, a supporting member 55 for supporting the substrate placement stages 44a, 44b are provided between the substrate placement stage 44 and the strut 49. Namely, the supporting member 55 is provided on bottom surfaces of the flanges 53a, 53b of the substrate placement stages 44a, 44b respectively. Deformation such as a bending of the substrate placement stages 44a, 44b can be reduced, which is caused when the supporting member 55 supports at least the bottom surfaces of the flanges 53a, 53b of the substrate placement stages 44a, 44b. Thus, the substrate 22 can be heated uniformly in the plane. Further, in a process of supplying the processing gas, the processing gas can be supplied to the substrate 22 uniformly in the plane, and the uniformity in the plane of the substrate during substrate processing can be improved. Further, damage of a surround part due to the deformation of the substrate placement stages 44a, 44b, can be prevented, and also generation of particles can be prevented, and further stable substrate processing can be performed. Moreover, the substrate processing with high reproducibility can be performed. Namely, for example when performing the substrate processing of forming a thin film on a substrate, a quality (for example, film thickness, etc.) of the thin film formed on the substrate can be uniform between the substrate processed first, and the substrate processed last in one batch.

Particularly, the thickness of the flanges 53a, 53b is smaller than the thickness of other portion of the substrate placement stages 44a, 44b, and therefore the flanges 53a, 53b are easily deformed when heating the substrate 22. In this case, the deformation of the flanges 53a, 53b can be suppressed, even if the substrate placement stages 44a, 44b are possibly in a deformed state due to heat treatment applied to the substrate placement stages 44a, 44b when the bottom surfaces of the flanges 53a, 53b are supported by the supporting member 55.

The supporting member 55 is made of a material (for example, stainless (SUS), etc.), which is the material having a lower thermal conductivity than the material constituting the substrate holding stages 44a, 44b, and hardly thermally deformed even at a high temperature. Thus, escape of the heat from the substrate placement stages 44a, 44b to the supporting member 55 can be reduced, and the substrate 22 can be uniformly heated. Namely, a heating efficiency can be increased, thus further improving the uniformity in the plane of the substrate during substrate processing.

The supporting member 55 is formed in a ring-shape along the bottom surfaces of the flanges 53a, 53b. Thus, the heat from the heating elements 45a, 45b absorbed by the supporting member 55 can be suppressed to minimum, and a reduction of the heating efficiency for the substrate 22 can be suppressed. Further, accumulation of the processing gas, etc., between the supporting member 55 and the struts 49 described later, can be prevented. Although the supporting member 55 has preferably an integral structure, it may also have two to three divisional structures.

An insertion hole 55a into which the strut 49 described later is inserted, is provided on the supporting member 55. Then, the supporting member 55 is configured to be supported by inserting an upper end of each strut 49 into the insertion hole 55a from below.

(Strut)

A plurality of struts 49 for supporting the flanges 53a, 53b from below via the supporting member 55, are provided on the substrate placement stages 44a, 44b. The struts 49 are respectively fixed to the processing vessel 47. By not supporting the lower part of the heaters 45a, 45b, but supporting the flanges 53a, 53b by the struts 49, the local escape of the heat can be prevented, and the uniformity in the plane of the substrate during substrate processing can be further improved. Further, the substrate processing with high reproducibility can be performed.

Further, each strut 49 is formed so that a diameter of a lower portion below its upper end is larger than a diameter of its upper end. Thus, the strut 49 has an insertion part 49b inserted into the insertion hole 55a, and a brim unit (step) 49a which is stopped at the supporting member 55. Namely, the supporting member 55 can be surely supported by the collar unit 49a of the strut 49. Moreover, a side wall of the insertion part 49b of the strut 49 is configured to be in contact with an inner wall of the insertion hole 55a in a state of being inserted into the insertion hole 55a. Thus, inclination, etc., of the strut 49 can be prevented, and inclination of the substrate placement surfaces 41a, 41b can be prevented. Accordingly, the uniformity in the plane of the substrate during substrate processing can be improved, and further the substrate processing with high reproducibility can be performed.

Exhaust holes are formed outside of the substrate placement stages 44a, 44b. Namely, exhaust baffle rings 54a, 54b as baffle plates are disposed on the upper surfaces the flanges 53a, 53b of the substrate placement stages 44a, 44b or outside of the flanges 53a, 53b, so as to surround each circumference. The exhaust baffle rings 54a, 54b are formed into a plate-shape and a ring type respectively having a thickness of about 2 to 5 mm, and usually have two to three divisional structures in consideration of maintenance.

A plurality of hole portions 56 as exhaust holes for exhausting a gas in the process chamber 50, are provided on an outer peripheral part of the exhaust baffle rings 54a, 54b. Namely, an exhaust hole group is formed in a ring-shape so as to evenly surround the substrate placement stages 44a, 44b, with a desired distance provided from the outer periphery of the substrate placement stages 44a, 44b. With such a specific distance between the hole portions 56 and the substrate placement stages 44a, 44b, a smooth exhausting flow can be obtained, thus improving exhaust efficiency. Further, the hole portions 56 are formed in the ring-shape, at positions outside of an arcuate portion 70 of the robot arm 64, when the robot arm 64 is stored in a storage space described later as a substrate carrier described later. Thus, the exhaust efficiency for exhausting the inside of the reaction chamber 50 is further improved. Also, the diameter of each hole portion 56 closer to the substrate placement stages 44a, 44b may be large, thus further improving the exhaust efficiency. Moreover, two hole portions 56 may be arranged side by side toward a center of the substrate placement stages 44a, 44b.

Lamp houses 67a, 67b are provided on a ceiling part of the processing vessel 47 (lid member 43) as second heating elements. The lamp houses 67a, 67b are configured to heat the substrates 22 from substantially an opposite side to the heaters 45a, 45b as first heating elements. Namely, a lamp house 67a is provided in an upper part of the first substrate placement stage 44a, and a lamp house 67b is provided in an upper part of the second substrate placement stage 44b. Lamp groups 57a, 57b as heating sources, are respectively provided in the lamp houses 67a, 67b, so that the substrate placement surfaces 41a, 41b of the substrate placement stages 44a, 44b are respectively irradiated with heat rays emitted from each of the lamp groups 57a, 57b.

(Substrate Carrier)

The robot arm 64 as the substrate carrier, is provided between the first processing member 59 and the second processing member 61 in the process chamber 16a, namely is provided to the partition member 46. The robot arm 64 is configured to transfer the substrates 22 into the process chamber 16a, and set in a standby-mode in the process chamber 16a when performing substrate processing. Namely, the robot arm 64 is configured to transfer one of two unprocessed substrates 22 on the first processing member 59, which is transferred into the process chamber 16a by the arm 42 of the vacuum robot 36 provided in the above-mentioned transfer chamber 12, to the second substrate placement stage 44b of the second processing member 61. Further, the robot arm 64 is configured to recover the processed substrates 22 from the second substrate placement stage 44b, and transfer it onto the upper finger 38a or the lower finger 38b of the arm 42 of the vacuum robot 36.

As shown in FIG. 3 to FIG. 5, the robot arm 64 includes a frame unit 66 and a shaft portion 68. An arcuate portion 70 having a diameter larger than an outer diameter of the substrate 22, is provided on the frame unit 66 so as to be approximately horizontal to the frame unit 66. Namely, an opening part is provided to the frame unit 66 in a circumferential direction, so as to receive and transfer the substrates 22 from/to the above-mentioned vacuum robot 36. For example three protruding portions 72 extending approximately horizontally toward a center from the arcuate portion 70, are provided on the arcuate portion 70 at a specific interval. The robot arm 64 is configured to support the substrates 22 through the protruding portions 72.

Biaxial driving unit (not shown) is provided to the shaft portion 68, for performing rotation and elevation of the robot arm 64. Namely, the frame unit 66 is configured to be rotated with the shaft portion 68 as the rotary shaft, and is configured to be elevated in the vertical direction. The shaft portion 68 is configured to be blocked from atmosphere through a magnetic seal that is water-cooled, when the inside of the reaction chamber 50 is vacuumized.

The robot arm 64 is preferably made of alumina ceramics (purity: 99.6% or more), because it is exposed to a high temperature (for example, about 250° C.) due to thermal radiation from the first substrate placement stage 44a and the second substrate placement stage 44b. Thus, by forming the robot arm 64 using alumina ceramics (purity: 99.6% or more) for example, having a small thermal expansion coefficient compared with a metal component, reduction of reliability in transferring the substrates due to bending by heat modification, can be prevented. However, the metal component is used for a base portion of the frame unit 66 of the robot arm 64, for adjusting a height position and a horizontal level.

The robot arm 64 is disposed to face the gate valve provided between the transfer chamber 12 and the process chamber 16a, so that the opening part of the frame unit 66 faces the gate valve 78 provided between the transfer chamber 12 and the process chamber 16a, when the arcuate portion 70 is positioned in the upper part of the first processing member 59. Thus, the robot arm 64 can transfer and place one of the substrates 22 out of the two substrates 22 transferred into the process chamber 16a by the vacuum robot 36 of the transfer chamber 12, onto the second substrate placement stage 44b of the second processing member 61 from above the first substrate placement stage 44a of the first processing member 59, by rotation and elevation of the shaft portion 68 being the rotation shaft. Note that the robot arm 64 is disposed in the reaction chamber 50 so as not to completely separate the space in the reaction chamber 50.

As described above, the robot arm 64 is configured to be set in the standby mode in the process chamber 16a when performing the substrate processing. Therefore, the robot arm 64 needs to be moved to a place where a gas flow in the process chamber 16a is not inhibited, when performing the substrate processing.

Specifically, the robot arm 64 is stored in a storage space when performing the substrate processing, which is the storage space formed by a shortest line connecting the hole portions 56 as exhaust holes and the upper end portion of the second substrate placement stage 44b, and the upper surface of the flange 53b. Thus, inhibition of a flow of the gas such as the processing gas and exhaust gas, etc., by the robot arm 64, can be reduced. Accordingly, the processing gas can be supplied to the substrates 22 placed on the second substrate placement surface 41b uniformly in the plane, and the gas can be exhausted uniformly in the atmosphere in the reaction chamber 50 (particularly the second processing member 61). As a result, the uniformity in the plane of the substrate during substrate processing, can be further improved.

(Gas Supply Unit)

As shown in FIG. 3, a gas supply unit for supplying the processing gas into the process chamber 16a, is provided in the upper part of the process chamber 16a. Namely, a first gas supply unit 51a for supplying the processing gas to the first processing member 59, and a second gas supply unit 51b for supplying the processing gas to the second processing member 61, are provided.

Gas supply ports 63a, 63b are provided to the lid member 43 constituting the processing vessel 47. Downstream ends of a first gas supply tube 65a and a second gas supply tube 65b are air-tightly connected to each of the gas supply ports 63a, 63b of the lid member 43.

A nitrogen gas supply source (not shown) for supplying a $N_2$ gas being a nitrogen-containing gas as the processing gas, a mass flow controller (not shown) as a flow rate control device, and a valve (not shown) being an open/close valve, are provided on the gas supply tubes 65a, 65b sequentially from the upstream side.

A controller 77 described later is electrically connected to the mass flow controller and the valve. The controller 77 is configured to control the mass flow controller and open/close of the valve, so that a flow rate of the gas supplied into the process chamber 16a is set to a specific flow rate. Thus, the controller 77 is configured to freely supply the $N_2$ gas being the processing gas into the process chamber 16a, through the gas supply tubes 65a, 65b and the gas supply ports 63a, 63b, while controlling the flow rate by the mass flow controller. Note that the nitrogen gas supply source, the mass flow controller and the valve may be independently formed, or may be shared by the gas supply units 51a, 51b.

The gas supply units 51a, 51b of this embodiment are respectively mainly constituted of the gas supply tubes 65a, 65b, the nitrogen gas supply source, the mass flow controller, and the valve.

(Exhaust Unit)

First exhaust ports 58 formed by the processing vessel 47 (lower side vessel 48) and the substrate placement stages 44a, 44b are respectively provided under the exhaust baffle rings 54a, 54b. Intermediate plates are provided under the substrate placement stages 44a, 44b of the processing vessel 47 (lower side vessel 48). Second exhaust ports 60 for exhausting the processing gas, etc., from the process chamber 16a (namely the first processing member 59 and the second processing member 61), are provided on the intermediate plates. Further, third exhaust ports 62 for exhausting the processing gas, etc., exhausted from the second exhaust ports 60 are provided on the bottom surface of the processing vessel 47 (lower side vessel 48). The upstream end of the gas exhaust tube (not shown) for exhausting the gas, is connected to the gas exhaust port 62. An APC valve (not shown) being a pressure adjuster, a valve (not shown) being an open/close valve, and a pump (not shown) being an exhaust device, are provided on the gas exhaust tube sequentially from the upstream side. Further, a pressure sensor (not shown) is provided on the gas exhaust tube.

The controller 77 descried later is electrically connected to the APC valve, the valve, the pump, and the pressure sensor. The inside of the process chamber 16a (namely the first processing member 59 and the second processing member 61) is configured to be exhausted by operating the pump and opening the valve. Namely, the processing gas supplied from the gas supply units 51a, 51b, flows along the substrates 22 placed on the substrate placement surfaces 41a, 41b of the substrate placement stages 44a, 44b in the reaction chamber 50, and is discharged from the process chamber 16a through the hole portions 56 of the exhaust baffle rings 54a, 54b, the first exhaust ports 58, the second exhaust ports 60, and the third exhaust ports 62.

Further, based on the pressure information detected by the pressure sensor, an opening degree of the APC valve is adjusted, to thereby set a pressure value in the process chamber 16a (reaction chamber 50) to about 0.1 Pa for example, in the vacuum state.

An exhaust unit of this embodiment is mainly constituted of first to third gas exhaust ports, the gas exhaust tube, the APC valve, the valve, and the pump.

(Control Unit)

The controller 77 as the control unit, is connected to the mass flow controller, valve, pressures sensor, APC valve, pump, heater, temperature sensor, rotation mechanism, and elevating mechanism, etc. The controller 77 controls a flow rate adjustment operation of each kind of gas by the mass flow controller, an open/close operation of the valve, a pressure adjustment operation by opening/closing the APC valve based on the pressure sensor, a temperature adjustment operation of the heaters 45a, 45b based on the temperature sensor, start/stop of the pump, a rotation speed adjustment operation of the rotation mechanism, and an elevation operation by the elevating mechanism, and so forth.

(3) Substrate Processing Step

Figure 8:
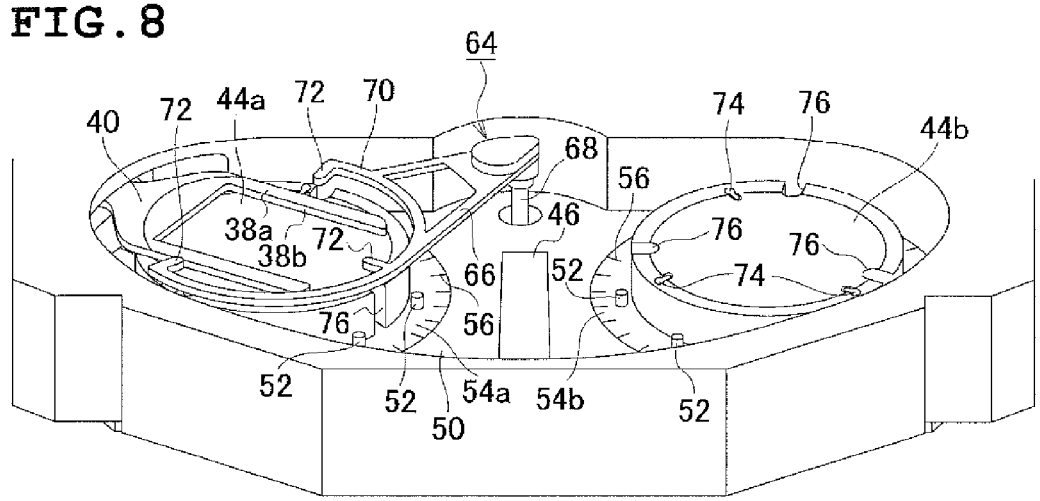
FIG. 8 is a schematic view showing a step of a substrate processing step according to an embodiment of the present invention.
Figure 9:
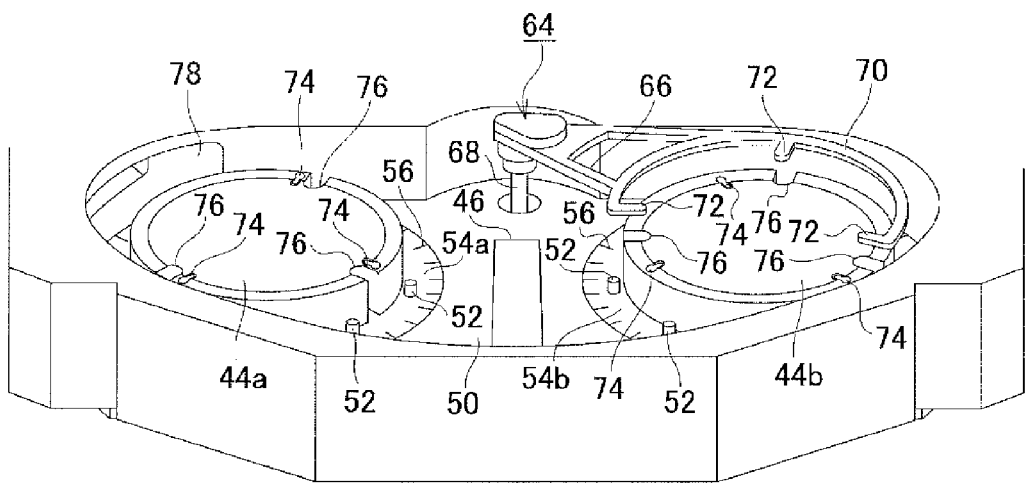
FIG. 9 is a schematic view showing a step of the substrate processing step according to an embodiment of the present invention.
Figure 10:
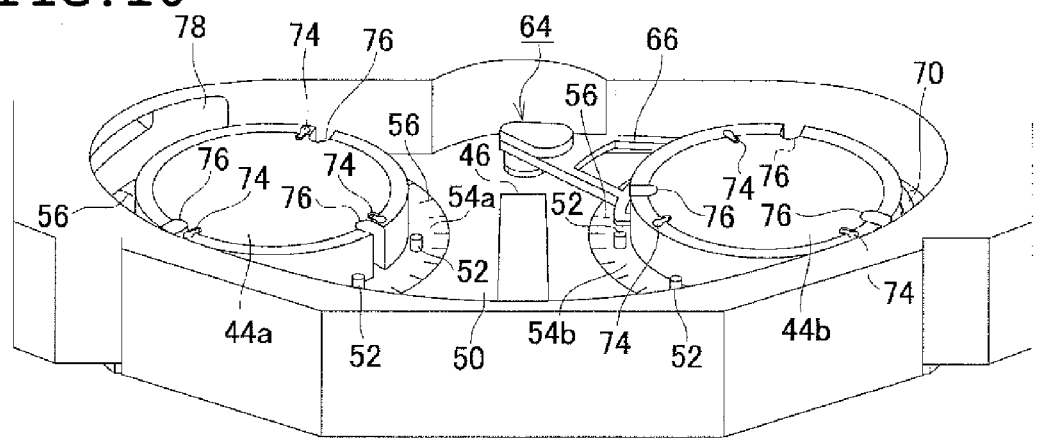
FIG. 10 is a schematic view showing a step of the substrate processing step according to an embodiment of the present invention.

Next, mainly based on FIG. 8 to FIG. 10, explanation is given for an example of the step of applying nitridation treatment to the substrates 22 such as wafers, as one of the manufacturing steps of the semiconductor device, using the process chamber 16a of the above-mentioned substrate processing apparatus 10. In the explanation given hereafter, the operation of each part constituting the substrate processing apparatus 10 is controlled by the controller 77.

FIG. 8 to FIG. 10 are schematic views showing one of the substrate processing steps according to this embodiment. Specifically, FIG. 8 is a schematic view showing a state of the process chamber 16a in transferring the substrates 22 into the process chamber 16a from the transfer chamber 12, and FIG. 9 is a schematic view showing a state of the process chamber 16a in transferring the substrates 22 to the second substrate placement stage 44b by the robot arm 64, and FIG. 10 is a schematic view showing a state that the robot arm 64 is stored in a storage space. In FIG. 8 to FIG. 10, in order to clearly show the operation of the robot arm 64, etc., the substrates 22 are not shown.

(Substrate Loading Step)

First, the gate valve 78 is opened, and as shown in FIG. 8, the vacuum robot 36 is moved into the process chamber 16a, while simultaneously transferring two substrates 22 placed on the upper finger 38a and the lower finger 38b of a pair of fingers 40. Thus, each substrate is loaded into the process chamber 16a (reaction chamber 50) from the transfer chamber 12 through the gate valve 78. Then, the vacuum robot 36 stops when the pair of fingers 40 reach a position above the first substrate placement stage 44a. At this time, the robot arm 64 is set in the standby-mode so that the frame unit 66 is positioned above the first substrate placement stage 44a, between the two substrates 22, namely between the upper finger 38a and the lower finger 38b of the pair of fingers 40.

(Substrate Placing Step)

Then, three substrate holding pins 74 penetrating the first substrate placement stage 44a are elevated, in a stop state of the pair of fingers 40 of the vacuum robot 36. As a result, the substrate holding pins 74 are in a state of protruding from the first substrate placement surface 41a of the first substrate placement stage 44a by a specific height. Then, the robot arm 64 set in the standby-mode between the upper finger 38a and the lower finger 38b of the vacuum robot 36, moves upward so as to be positioned just under the upper finger 38a.

Thereafter, the substrate 22 placed on the lower finger 38b is transferred onto three substrate holding pins 74 penetrating the first substrate placement stage 44a, and the substrate 22 placed on the upper finger 38a is transferred onto the frame unit 66 (protruding portion 72) of the robot arm 64. After two substrates 22 are transferred onto the first substrate placement stage 44a and the robot arm 64, the pair of fingers 40 of the vacuum robot 36 are returned to the transfer chamber 12.

Then, the substrate 22 transferred by the lower finger 38b is transferred onto the first substrate placement surface 41a and is placed thereon, by lowering the three substrate holding pins 74 penetrating the first substrate placement stage 44a.

Further, as shown in FIG. 9, in the robot arm 64, the arcuate portion 70 (protruding portion 72) of the frame unit 66 moves upward of the second substrate placement stage 44b by rotation of the shaft portion 68. Then, three substrate holding pins 74 penetrating the second substrate placement stage 44b are elevated, thus forming a state that the substrate holding pins 74 are protruded from the second substrate placement surface 41b by the specific height. Then, the substrate 22 placed on the protruding portion 72 of the robot arm 64 is transferred onto the three substrate holding pins 74 penetrating the second substrate placement stage 44b, and the substrate holding pins 74 penetrating the second substrate placement stage 44b are lowered. Thus, the substrate 22 transferred onto the second substrate placement stage 44b by the robot arm 64, is transferred onto the second substrate placement surface 41b and is placed thereon.

When placement of the substrate 22 on the second substrate placement surface 41b is ended, as shown in FIG. 10, the robot arm 64 is lowered by lowering the shaft portion 68. Specifically, the robot arm 64 is moved lower than the second substrate placement surface 41b while fitting the protruding portions 72 formed on the frame unit 66 into groove portions 76 formed on the second substrate placement stage 44b respectively. At this time, the robot arm 64 is preferably lowered so as to be stored in the above-mentioned storage space. Thus, while performing nitridation treatment as described later, the substrate 22 can be processed so as to be uniform in the plane without inhibiting the flow of the processing gas supplied from the gas supply units 51a, 51b, and particularly the flow of the processing gas flowing to the lower part from the upper part of the second processing member 61.

(Temperature Rise/Pressure Adjustment Step)

Subsequently, power is supplied to each of the heaters 45a, 45b housed in the substrate placement stages 44a, 44b and lamp groups 57a, 57b of the lamp houses 67a, 67b, to thereby heat the surface of the substrate 22 placed on each of the substrate placement surfaces 41a, 41b of the substrate placement stages 44a, 44b so as to a desired temperature (for example, 450° C.). At this time, temperatures of the heaters 45a, 45b and the lamp groups 57a, 57b are adjusted by controlling the power supplied to the heaters 45a, 45b and the lamp groups 57a, 57b based on the temperature information detected by the temperature sensor (not shown).

Further, inside of the reaction chamber 50 is vacuum-exhausted by the pump (not shown) so that the inside of the reaction chamber 50 is set to a desired pressure (for example, 0.1 Pa to 300 Pa). At this time, the pressure in the reaction chamber 50 is measured by the pressure sensor (not shown), and based on the measured pressure information, the opening degree of the APC valve (not shown) is feedback-controlled.

(Substrate Processing Step)

In parallel to the heat treatment applied to the substrate 22, the $N_2$ gas being the processing gas is supplied into the process chamber 16a. Specifically, the valve (not shown) for the gas supply units 51a, 51b is opened, to thereby supply the processing gas to the first processing member 59 and the second processing member 61 from the gas supply tubes 65a, 65b. At this time, the mass flow controller (not shown) is adjusted so that the flow rate of the processing gas becomes a desired flow rate. According to this embodiment, the nitrogen ($N_2$) gas is supplied for example as the processing gas. However, the processing gas is not limited thereto, and an oxygen-containing gas may be used in a case of asking, and an inert gas, etc., may be used in a case of heating. Thus, a specific processing is performed by heating the substrate 22 in an atmosphere of the supplied processing gas.

When the specific processing is ended after elapse of the specific time, the valve for the gas supply units 51a, 51b is closed, to thereby stop the supply of the $N_2$ gas into the process chamber 16a (the first processing member 59 and the second processing member 61).

(Return to Atmosphere/Substrate Unloading Step)

When the specific processing is ended, the supply of the power to the heaters 45a, 45b and the lamp groups 57a, 57b is stopped, and the temperature in the process chamber 16a is dropped, then the opening degree of the APC valve (not shown) for the exhaust unit is adjusted, to thereby make the pressure in the process chamber 16a to an atmospheric pressure. Then, the processed two substrates 22 are transferred to the transfer chamber 12 from the inside of the reaction chamber 50 (the process chamber 16a) based on a reversed procedure to the procedure shown in the above-mentioned substrate loading step and the substrate placing step. Namely, the pair of fingers 40 of the robot arm 64 and the vacuum robot 36 perform the operation as shown in FIG. 8 to FIG. 10 based on the reversed procedure, to thereby unload the processed two substrates 22 from the process chamber 16a. Then, the substrate processing step according to this embodiment is ended.

(4) Effect of this Embodiment

According to this embodiment, one or a plurality of effects shown below can be exhibited.

(a) According to this embodiment, there are provided the substrate placement stages 44a, 44b in the process chamber 16a, including the flanges 53a, 53b provided along the side faces of the substrate placement stages 44a, 44b, for placing the substrates 22 on the substrate placement surfaces 41a, 41b. Then, the heating elements 45a, 45b for heating the substrates 22 are housed in the substrate placement stages 44a, 44b. Moreover, a plurality of struts 49 for supporting the flanges 53a, 53b from below are provided, and the supporting member 55 is provided between the substrate placement stages 44a, 44b and the plurality of struts 49. Thus, the uniformity in the plane of the substrate during substrate processing can be improved, and the substrate processing with high reproducibility can be performed.

Namely, by providing the supporting member 55, bending and deformation of the substrate placement stages 44a, 44b can be prevented, even in a case that the substrate placement stages 44a, 44b are heated by the heating elements 45a, 45b. The deformation of the flanges 53a, 53b having particularly small thickness can be prevented in the substrate placement stages 44a, 44b. Thus, inclination of the substrate placement surfaces 41a, 41b due to the deformation of the substrate placement stages 44a, 44b, can be prevented, the processing gas can be supplied to the substrate 22 uniformly in the plane of the substrate, and the uniformity in the plane of the substrate during substrate processing can be improved. Further, the substrate processing with high reproducibility can be performed.

Further, damage of the strut 49 due to the deformation of the substrate placement stages 44a, 44b can be prevented. Specifically, damage of the strut 49 can be prevented, which is caused at a connection place between the substrate placement stages 44a, 44b, and the strut 49, due to the deformation of the substrate placement stages 44a, 44b. Thus, the inclination of the substrate placement surfaces 41a, 41b can be prevented, and the uniformity in the plane of the substrate during substrate processing can be further improved.

Further, by supporting the substrate placement stages 44a, 44b by the struts 49 from under the flanges 53a, 53b thorough the supporting member 55, the heat from the heating elements 45a, 45b is transmitted to the struts 49, to thereby prevent the generation of the local escape of the heat. Accordingly, the substrate 22 can be heated so that the temperature in the plane is uniform, thus more improving the uniformity in the plane of the substrate during substrate processing.

Further, by preventing the deformation of the substrate placement stages 44a, 44b, contact between the substrate placement stages 44a, 44b, and a component in the circumference of the substrate placement stages 44a, 44b such as the substrate holding pins 74, etc., can be prevented, thus reducing the inhibition in transferring the substrates 22. In addition, generation of particles due to the contact between the substrate placement stages 44a, 44b, and a circumferential component can be reduced.

(b) According to this embodiment, the supporting member 55 is made of a hardly thermally deformed material with lower conductivity than that of the substrate placement stages 44a, 44b. Thus, the uniformity in the plane of the substrate during substrate processing can be further improved. Namely, escape of the heat to the supporting member 55 from the substrate placement stages 44a, 44b can be reduced, and the heating efficiency of the substrate 22 can be enhanced, and the substrate 22 can be further uniformly heated.

(c) According to this embodiment, the substrate placement stages 44a, 44b are made of aluminum. Thus, the heat from the heaters 45a, 45b can be efficiently uniformly transmitted to the substrate 22, and the effect of the present invention can be more easily obtained.

(d) According to this embodiment, the supporting member 55 has a ring-shape along the bottom surfaces of the flanges 53a, 53b. Thus, the heat from the heating elements 45a, 45b absorbed by the supporting member 55 can be suppressed to minimum, thus reducing the drop of the heating efficiency for the substrate 22, and the uniformity in the plane of the substrate during substrate processing can be improved. Further, accumulation of the processing gas, etc., between the supporting member 55 and the strut 49 can be prevented.

(e) According to this embodiment, the insertion hole 55a is formed on the supporting member 55, so that the upper end of each strut 49 is inserted into the insertion hole 55a from below. Then, by forming the strut 49 so that the diameter of the lower portion below its upper end is larger than the diameter of its upper end, the insertion part 49b inserted into the insertion hole 55a, and the collar unit 49a which is stopped at the supporting member 55, are formed. Then, the side wall of the insertion part 49b of the strut 49 is brought into contact with the inner wall of the insertion hole 55a, with the insertion part 49b inserted into the insertion hole 55a formed on the supporting member 55. Thus, the inclination of the strut 49 can be reduced, and the uniformity in the plane of the substrate during substrate processing can be further improved.

A conventional substrate processing apparatus will be described hereafter using FIG. 11 to FIG. 13, for reference.

Figure 11:
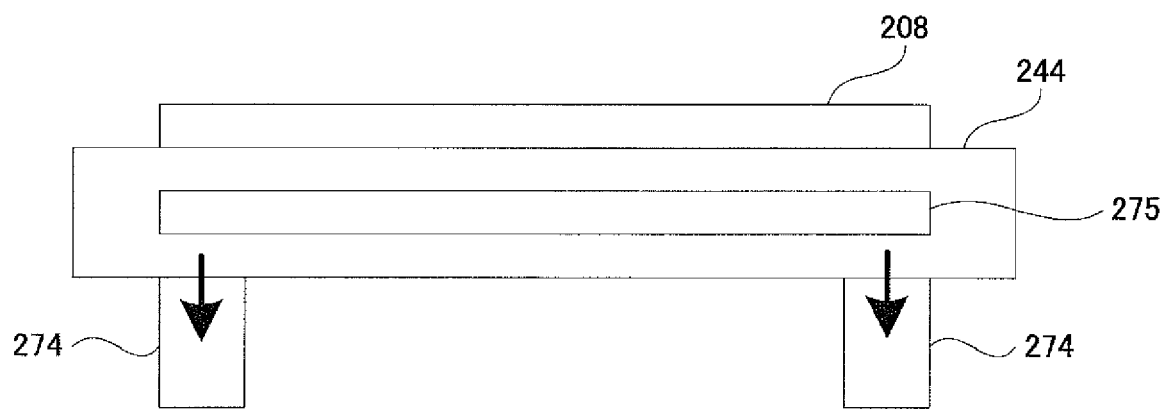
FIG. 11 is a vertical sectional schematic view of the substrate placement stage housed in a conventional substrate processing apparatus.

As shown in FIG. 11, in the substrate placement stage 244 provided in the conventional substrate processing apparatus, the struts 274 are sometimes provided under the heating element 275 housed in the substrate placement stage 244. When the substrate 208 such as a wafer is placed on the substrate placement surface of the above-mentioned substrate placement stage 244 to thereby heat the substrate 208 by the heating element 275, the heat from the heating element 275 is transmitted to the struts 274, and the local escape of the heat is generated in some cases as shown in arrow in FIG. 11. Therefore, during substrate processing, the temperature of the portion of the substrate 208 with the struts 274 provided thereunder, becomes low in some cases, compared with the temperature of the portion of the substrate 208 with the struts 274 not provided thereunder, and it is not possible to heat the substrate 208 so as to be uniform in the plane in some cases. Further, the struts 274 are deformed in some cases by being heated. Thus, the substrate placement stage 244 is inclined, and the processing gas cannot be supplied in some cases uniformly in the plane of the substrate 208 placed on the substrate placement surface. As a result, the uniformity in the plane of the substrate during substrate processing is reduced in some cases.

Figure 12:
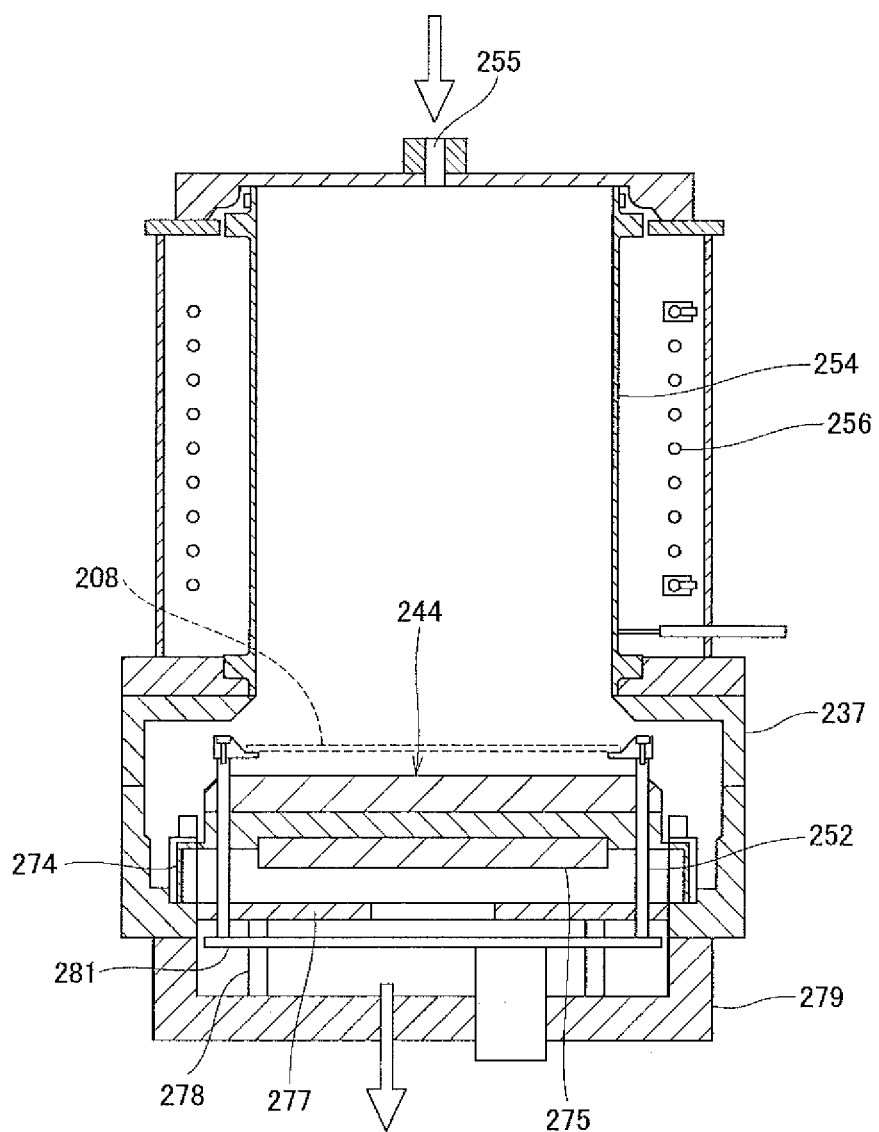
FIG. 12 is a vertical sectional schematic view of the conventional substrate processing apparatus.

Therefore, as shown in FIG. 12 and FIG. 13, there is the substrate processing apparatus including the substrate placement stage 244 with the flange 245 provided on the side face, and configured to support the substrate placement stage 244 by supporting the flange 245 from below by the strut 294. FIG. 12 is a vertical sectional view showing an outline of the conventional substrate processing apparatus, and FIG. 13 is a view showing an outline of the substrate placement stage installed in the conventional substrate processing apparatus, wherein (a) is a vertical sectional view of the substrate placement stage, and (b) is a partial expanded view of (a).

As shown in FIG. 12, a gas supply port 255 for introducing the processing gas, is provided in the upper part of the reaction tube 254. The reaction tube 254 is made of quartz, etc., for example, and is formed into a cylindrical shape. A high frequency coil 256 is provided around the reaction tube 254, for causing an electric discharge in the processing gas, and generating plasma. A high frequency power source (not shown) for supplying a high frequency power, is connected to the high frequency coil 256, so that a high frequency current for generating plasma, is applied to the high frequency coil 256, by the high frequency power source.

A process chamber 237 for applying a specific processing to the substrate 208, is provided in the lower part of the reaction tube 254. Namely, the reaction tube 254 is air-tightly erected in the process chamber 237. The processing camber 237 is a metal sealed vessel.

The substrate placement stage (susceptor table) 244 for placing the substrate 208 on the substrate placement surface, is provided on the bottom surface of the process chamber 237. The flange 245 (see FIG. 13) is provided on the side face of the substrate placement stage 244. Then, the substrate placement stage 244 is supported by supporting the flange 245 from below by a plurality of (for example four) struts 274. The substrate placement stage 244 includes the heating element (heater) 275 for heating the substrate 208. The substrate placement stage 244 is made of aluminum. The aluminum has a high thermal conductivity, and allows the heat generated in the heating element 275 to be efficiently transmitted to the substrate 208.

An exhausting plate 277 is disposed under the substrate placement stage 244, and the exhausting plate 277 is supported by a bottom substrate 279 through a guide shaft 278. The bottom substrate 279 is air-tightly provided on a lower surface of the process chamber 237.

An elevation substrate 281 is provided with the guide shaft 278 as a guide, so as to be freely elevated. At least three substrate holding pins 252 are erected on the elevation substrate 281. The substrate holding pins 252 are freely passed through the substrate placement stage 244. The substrate 208 is placed on upper ends of the substrate holding pins 252, and by elevation of the substrate holding pins 252, the substrate 208 is placed on the substrate placement stage 244, or is lifted from the substrate placement stage 244.

With such a substrate processing apparatus, the local escape of the heat from the heating element can be prevented by absorbing the heat by the struts, and the temperature of the substrate can be uniform in the plane. However, the uniformity in the plane of the substrate during substrate processing is still reduced in some cases. Namely, when the substrate processing is performed using such a substrate processing apparatus, the substrate 208 is heated by the heating element 275 provided on the substrate placement stage 244. However, in this case, the substrate placement stage 244 made of aluminum as described above, is also heated. As described above, aluminum has a property that the thermal conductivity is high, and meanwhile has a property that its intensity is weak in a high temperature state, and deformation easily occurs. Therefore, when the substrate placement stage 244 made of aluminum is heated, for example the substrate placement stage 244 is sometimes bent and deformed as shown by dot line in FIG. 13(a). Particularly, the flange 245 has a smaller thickness than the thickness of other portion of the substrate placement stage 244, and therefore the flange 245 is easily deformed. Such deformations of the substrate placement stage 244 and the flange 245 are remarkably generated in a case of the processing in the high temperature state. Further, due to the deformation of the substrate placement stage 244 (flange 245), the strut 274 is sometimes damaged at a connection part 276 between the strut 274 and the substrate placement stage 244, as shown in FIG. 13(b). Thus, when the substrate placement stage 244 and the flange 245 are deformed and the strut 274 is damaged, the substrate placement surface is inclined in some cases. Accordingly, the processing gas cannot be supplied to the substrate 208 placed on the substrate placement surface of the substrate placement stage 244, so as to be uniform in the plane, thus reducing the uniformity in the plane of the substrate during substrate processing in some cases.

Further, by heating the substrate placement stage 244 by the heating element 275, the strut 274 is also heated by thermal conduction, thus deforming the struts 274 in some cases. Due to the deformation of the struts 274, the substrate placement stage 244 is inclined, and a distance between the substrate 208 and the gas supply port 255 is sometimes changed. In this case, the processing gas cannot be supplied uniformly in the plane of the substrate during substrate processing, thus sometimes reducing the uniformity in the plane of the substrate during substrate processing.

Further, when the substrate placement stage 244 is inclined, the substrate placement stage 244 and the circumferential component (for example the substrate holding pins 252, etc.) are brought into contact with each other, thus causing a trouble in transferring the substrates 208 in some cases. Further, particles are sometimes generated due to the contact between the substrate placement stage 244 and the circumferential component, thus causing an adverse influence in the substrate processing in some cases. Namely, a stable substrate processing cannot be performed.

Meanwhile, according to this embodiment, there are provided the substrate placement stages 44a, 44b in the process chamber 16a, including the flanges 53a, 53b on the side face, for placing the substrates 22 on the substrate placement surfaces 41a, 41b. Then, the heating elements 45a, 45b for heating the substrates 22 are housed in the substrate placement stages 44a, 44b. Further, a plurality of struts 49 for supporting the flanges 53a, 53b from below are provided, and the supporting member 55 is provided between the substrate placement stages 44a, 44b, and the plurality of struts 49. Therefore, the above-described problem can be effectively solved, and the uniformity in the plane of the substrate during substrate processing can be improved, and the substrate processing with stable reproducibility can be performed.

Other Embodiment of the Present Invention

As described above, embodiments of the present invention have been specifically described. However, the present invention is not limited to the above-mentioned embodiments, and can be variously modified in a range not departing from the gist of the invention.

In the above-mentioned embodiment, the flanges 53a, 53b are integrally formed with the substrate placement stages 44a, 44b. However, for example the substrate placement stages may also include the substrate placement part and the flange unit.

Further, for example, the flanges 53a, 53b may be formed by the supporting member 55 by making the diameter of the supporting member 55 larger than the diameter of each bottom surface of the substrate placement stages 44a, 44b.

Further, in the above-mentioned embodiment, the baffle rings 54 as a baffle plate with hole portions 56 provided thereon as exhaust holes, are provided on the upper surfaces of the flanges 53a, 53b. However, the hole portions 56 may be provided along the outer periphery of the flanges 53a, 53b.

Further, in the above-mentioned embodiment, explanation is given for a case that two substrate placement stages 44 are provided in the process chamber 16a. However, the substrate placement stage provided in the process chamber 16a may be one or three or more.

In the above-mentioned embodiment, the nitrogen gas is supplied into the process chamber 16a, and prescribed nitridation treatment is applied to the substrate 22. However, the present invention is not limited thereto. Namely, asking may be applied to the substrate 22 by supplying an excited oxygen ($O_2$) gas for example, or annealing, etc., may be applied thereto by supplying the inert gas.

Preferable Aspects of the Invention

Preferred aspects of the present invention will be described hereafter.

According to an aspect of the present invention, there is provided a substrate processing apparatus, including:

a process chamber configured to process a substrate:

a gas supply unit configured to supply a processing gas into the process chamber;

a substrate placement stage installed in the process chamber, and configured to place the substrate on a substrate placement surface, with a flange provided on its side face;

a heating element arranged in the substrate placement stage and configured to heat the substrate;

a plurality of struts configured to support the flange from below, and an exhaust unit configured to exhaust an atmosphere in the process chamber, wherein the supporting member is provided between the substrate placement stage and the plurality of struts.

Preferably, the supporting member has a lower thermal conductivity than that of the substrate placement stage, and is made of a hardly thermally deformed material.

Further preferably, the substrate placement stage is made of aluminum.

Further preferably, the supporting member has a ring shape along a bottom surface of the flange.

Further preferably, insertion holes are formed on the supporting member, and upper ends of the struts are inserted into the insertion holes from below.

Further preferably, a diameter of a lower portion below the upper end of each strut, is formed to be larger than the diameter of the upper end of the strut, to thereby form an insertion part inserted into each insertion hole, and a collar unit that stops at the supporting member.

Further preferably, a side wall of the insertion part is brought into contact with an inner wall of the insertion hole of a strut, with the insertion part inserted into the insertion hole.

Further preferably, degassing holes are provided at positions in contact with at least the insertion holes of the flange.

Further preferably, the supporting member has an integral structure.

Further preferably, the substrate processing apparatus includes a substrate carrier provided in the process chamber and configured to transfer the substrates into the process chamber, and set in a standby mode in the process chamber while processing each substrate;

a surface of the flange is formed to be lower than a height position of the substrate placement surface;

one or a plurality of exhaust holes are formed outside of the substrate placement surface;

a storage space of the substrate carrier is formed by a line connecting the exhaust hole and the upper end portion of the substrate placement stage, and an upper surface of the flange; and the substrate carrier is stored in the storage space while processing each substrate.

Further preferably, one or a plurality of the exhaust holes are formed on a baffling plate, and the baffling plate is disposed on an upper surface of the flange or outside of the flange.

According to other aspect of the present invention, there is provided a substrate supporter, including:

a substrate placement stage configured to place a substrate on a substrate placement surface, with a flange provided on its side face;

a heating element arranged in the substrate placement stage, and configured to heat the substrate; and a plurality of struts configured to support the flange from below, wherein a supporting member is provided between the substrate placement stage and the plurality of struts.

According to further other aspect of the present invention, there is provided a method of manufacturing a semiconductor device, including:

loading a substrate into a process chamber;

placing the substrate on a substrate placement surface of a substrate supporter including a substrate placement stage installed in the process chamber, with a flange provided on its side face and configured to place the substrate on the substrate placement surface, and a plurality of struts for supporting the flange from below, and a supporting member for supporting at least the flange between the substrate placement stage and the plurality of struts;

processing the substrate by heating the substrate by the heating element while exhausting an inside of the process chamber by an exhaust unit, with the substrate placed on the substrate placement surface, and supplying a processing gas into the process chamber by a gas supply unit; and unloading the substrate after processing, from the process chamber.

10 Substrate processing apparatus
12 Transfer chamber
14a, 14b Load lock chamber
16a, 16b Process chamber
20 Atmosphere transfer chamber
22 Substrate
36 Vacuum robot
38a Upper finger
38b Lower finger
40 Pair of fingers
42 Arm
44a, 44b Substrate placement stage
45a, 45b Heater (heating element)
46 Partition member
50 Reaction chamber
51a, 51b Gas supply unit
54a, 54b Exhaust baffling ring
55 Supporting member
56 Hole
58 First exhaust port
60 Second exhaust port
62 Third exhaust port
64 Robot arm
66 Frame unit
68 Shaft portion
70 Arcuate portion
72 Protruding portion
74 Substrate holding pin
76 Groove portion

The invention claimed is:

1. A substrate processing apparatus, comprising:
a process chamber configured to process a substrate:
a gas supply unit configured to supply a processing gas into the process chamber;
a substrate placement stage installed in the process chamber, and configured to place the substrate on a substrate placement surface, with a flange provided on its side face;
a heating element arranged in the substrate placement stage and configured to heat the substrate;
a plurality of struts configured to support the flange from below;
an exhaust unit configured to exhaust an atmosphere in the process chamber; and
a supporting member provided between the flange and the plurality of struts,
wherein insertion holds into which upper ends of the struts are inserted from below, are formed to penetrate the supporting member in a vertical direction of the supporting member,
wherein a diameter of a lower portion below the upper end of each of the struts, is formed to be larger than a diameter of the upper end of each of the struts, to thereby form an insertion part into each of the insertion holes, and a collar unit which stops at the supporting member, in each of the struts, and
wherein the struts are configured to support the flange from below via the supporting member, by engaging the supporting member with the collar unit.

2. The substrate processing apparatus according to claim 1, wherein the supporting member is made of a material having a lower thermal conductivity than that of the substrate placement stage.

3. The substrate processing apparatus according to claim 2, wherein the substrate placement stage is made of aluminum.

4. The substrate processing apparatus according to claim 3, wherein the substrate processing apparatus includes a substrate carrier provided in the process chamber and configured to transfer the substrates in the process chamber, and set in a standby mode in the process chamber while processing each substrate;
a surface of the flange is formed to be lower than a height position of the substrate placement surface;
one or a plurality of exhaust holes are formed outside of the substrate placement surface;
a storage space of the substrate carrier is formed between a shortest line connecting the exhaust hole and the upper end portion of the substrate placement stage, and an upper surface of the flange; and
the substrate carrier is stored in the storage space while processing each substrate.

5. The substrate processing apparatus according to claim 2, wherein the substrate processing apparatus includes a substrate carrier provided in the process chamber and configured to transfer the substrates in the process chamber, and set in a standby mode in the process chamber while processing each substrate;
a surface of the flange is formed to be lower than a height position of the substrate placement surface;
one or a plurality of exhaust holes are formed outside of the substrate placement surface;
a storage space of the substrate carrier is formed between a shortest line connecting the exhaust hole and the upper end portion of the substrate placement stage, and an upper surface of the flange; and the substrate carrier is stored in the storage space while processing each substrate.

6. The substrate processing apparatus according to claim 1, wherein the substrate placement stage is made of aluminum.

7. The substrate processing apparatus according to claim 6, wherein the substrate processing apparatus includes a substrate carrier provided in the process chamber and configured to transfer the substrates in the process chamber, and set in a standby mode in the process chamber while processing each substrate;

a surface of the flange is formed to be lower than a height position of the substrate placement surface;

one or a plurality of exhaust holes are formed outside of the substrate placement surface;

a storage space of the substrate carrier is formed between a shortest line connecting the exhaust hole and the upper end portion of the substrate placement stage, and an upper surface of the flange; and the substrate carrier is stored in the storage space while processing each substrate.

8. The substrate processing apparatus according to claim 1, wherein the substrate processing apparatus includes a substrate carrier provided in the process chamber and configured to transfer the substrates in the process chamber, and set in a standby mode in the process chamber while processing each substrate;

a surface of the flange is formed to be lower than a height position of the substrate placement surface;

one or a plurality of exhaust holes are formed outside of the substrate placement surface;

a storage space of the substrate carrier is formed between a shortest line connecting the exhaust hole and the upper end portion of the substrate placement stage, and an upper surface of the flange; and the substrate carrier is stored in the storage space while processing each substrate.

9. The substrate processing apparatus according to claim 1, wherein the supporting member has a ring-shape and is provided along a bottom surface of the flange.

10. The substrate processing apparatus according to claim 1, comprising an exhaust baffle ring disposed on an upper surface of the flange or outside of the flange and having a plurality of hole portions.

11. The substrate processing apparatus according to claim 1, wherein a side wall of the insertion part is configured to be in contact with an inner wall of the insertion hole in a state of being inserted into the insertion hole.

12. A substrate supporter, comprising:

a substrate placement stage configured to place a substrate on a substrate placement surface, with a flange provided on its side face;

a heating element arranged in the substrate placement stage, and configured to heat the substrate;

a plurality of struts configured to support the flange from below; and a supporting member provided between the flange and the plurality of struts, wherein insertion holds into which upper ends of the struts are inserted from below, are formed to penetrate the supporting member in a vertical direction of the supporting member, wherein a diameter of a lower portion below the upper end of each of the struts, is formed to be larger than a diameter of the upper end of each of the struts, to thereby form an insertion part into each of the insertion holes, and a collar unit which stops at the supporting member, in each of the struts, and wherein the struts are configured to support the flange from below via the supporting member, by engaging the supporting member with the collar unit.

13. The substrate supporter according to claim 12, wherein the supporting member has a ring-shape and is provided along a bottom surface of the flange.

* * * * *